United States Patent
Johnson

[19]

[11] Patent Number: 5,945,797
[45] Date of Patent: Aug. 31, 1999

[54] MOTOR CONTROLLER HAVING DEAD ENDED WINDING DETECTION CAPABILITY ON ALL WINDINGS

[75] Inventor: Lynn Stewart Johnson, Aurora, Ill.

[73] Assignee: Siemens Energy & Automation, Inc., Alpharetta, Ga.

[21] Appl. No.: 09/164,869

[22] Filed: Oct. 2, 1998

[51] Int. Cl.[6] .............................. G01R 31/02; G01R 31/34
[52] U.S. Cl. .............................. 318/490; 324/772; 361/88
[58] Field of Search .................................. 318/767, 490; 361/23, 88; 324/772

[56] References Cited

U.S. PATENT DOCUMENTS

| 5,469,351 | 11/1995 | Masrur et al. | 363/56 |
| 5,568,034 | 10/1996 | Huggett et al. | 318/802 |
| 5,574,346 | 11/1996 | Chavan et al. | 318/434 |

*Primary Examiner*—Bentsu Ro

[57] ABSTRACT

Problems associated with time consuming troubleshooting of an incorrectly wired delta motor system are eliminated in a motor controller that automatically detects when each of the three phase lines of a three phase power source have been connected to both ends of one of the three windings in a dead ended winding configuration.

13 Claims, 5 Drawing Sheets

L1-L2
FROM UTILITY POWER

L2-L3
FROM UTILITY POWER

L3-L1
FROM UTILITY POWER (L1-T1>0)
EXPECTED SIGNAL FROM DELTA MOTOR (L2-T2>0)
EXPECTED SIGNAL FROM DELTA MOTOR (L3-T3>0)
EXPECTED SIGNAL FROM DELTA MOTOR

L1-L2
FROM UTILITY POWER

L2-L3
FROM UTILITY POWER

L3-L1
FROM UTILITY POWER (L1-T1=0)

(L2-T2=0)

(L3-T3=0)

MOTOR CONTROLLER HAVING DEAD ENDED WINDING DETECTION CAPABILITY ON ALL WINDINGS

FIELD OF THE INVENTION

This invention relates to motor controllers and more particularly, to a controller for a delta motor that automatically detects when each of the three phase lines of a three phase power source have been connected to both ends of one of the three motor windings in a dead ended winding configuration.

BACKGROUND OF THE INVENTION

A delta motor system typically includes a delta motor, a three phase power source and a motor controller. During start up, delta motors often experience potentially damaging high inrush currents and starting torques. This can adversely effect the performance of the motor drive and increase general wear and tear leading to higher maintenance costs. In addition, current peaks during motor startup can also cause voltage disturbances in the power supply.

Motor controllers are typically used to restrict the motor torque and reduce the high starting currents by controlling the application of voltage from the three phase power source to the delta motor. The motor controller generally includes a set of three control switches that are connected between the line voltage terminals of the three phase power source and each of the windings of the delta motor. The motor controller regulates the voltage from the three phase power source to the delta motor by selectively opening and closing the three control switches. The proper operation of the delta motor is dependent on the proper regulation of the control switches.

The motor controller's internal timing mechanisms are specifically designed to regulate the application of specific line voltages from the three phase power source to specific delta motor windings based on a predesignated wiring configuration. Conventional electrical leads are typically used to connect the delta motor windings to the control switches and to the line voltage terminals. Since the electrical leads providing connection to the delta motor terminals are not always clearly marked, mistakes in wiring the delta motor system are common.

A common wiring error occurs when each of the three line voltage lines of a three phase power source have been connected to both ends of one of the three motor windings in a dead ended winding configuration. When a run command is issued to a delta motor having all of its windings in a dead ended configuration, the indicator for the motor controller will show that it is running and the indicator for the delta motor will show that the delta motor is up to speed even though the delta motor has not actually started and there is no current flowing through any of the windings.

Clearly it would be desirable to use a motor controller that automatically detects when all of the delta motor windings are dead ended. Such a motor controller would facilitate the wiring process of a delta motor system by detecting the fault condition during the installation process and result in reduced troubleshooting time and expenses. The present invention seeks to achieve these objectives.

SUMMARY OF THE INVENTION

It is a principal object of this invention to provide a new and improved motor controller that automatically detects a fault condition when each of the three line voltage lines have been connected to both ends of one of the three delta motor windings in a dead ended winding configuration. More specifically, it is an object of the invention to provide a motor controller that facilitates the wiring process of a delta motor system by detecting the fault condition during the installation process resulting in reduced troubleshooting time and expenses.

An exemplary embodiment of the invention achieves the foregoing object in a motor controller for use in a motor system including a multiphase power source having three supply lines and a delta motor having three windings. Each of the windings have a first lead and a second lead where the first lead is intended for connection to a selected supply line.

The motor controller includes a plurality of switching means and an error detecting means. The plurality of switching means are intended for connection between selected supply lines and the second leads of selected windings. The error detecting means is connected across each of the switching means and is operable to detect a fault condition if the first and second leads of each of the three winding are connected to a single supply line. An indicating means may be connected to the error detecting means to generate an indication in response to the fault condition.

In one embodiment, the plurality of switching means comprise solid state devices.

In another embodiment, the plurality of switching means comprise SCRs or triacs.

In another form of the invention, the error detecting means may include a sensing means that is connected across each of the individual switching means and is operable to generate a plurality of outputs representative of the voltages across each of the switching means.

The error detecting means may also include a decoding means, connected to the sensing means, for detecting the fault condition if the voltages across each of the individual switching means is equal to zero.

Other objects and advantages of the invention will become apparent from the following specification taken in conjunction with the accompanying drawings.

DETAILED DESCRIPTION OF THE PREFERRED EMBODIMENT

A diagram of a conventional delta motor system 10 including a prior art motor controller 12 is depicted in FIG.

1. The delta motor system 10 typically consists of a three phase power source 14, a delta motor 16 and a motor controller 12. The motor controller 12 generally includes a set of three control switches S1, S2, S3 for providing electrical connection between the line voltage terminals L1, L2, L3 of the three phase power source 14 and the delta motor 16. The motor controller 12 regulates the voltage applied to the delta motor 16 by selectively opening and closing the three control switches S1, S2, S3. The proper operation of the delta motor 16 is dependent upon the proper regulation of the control switches S1, S2, S3.

Figure 1:
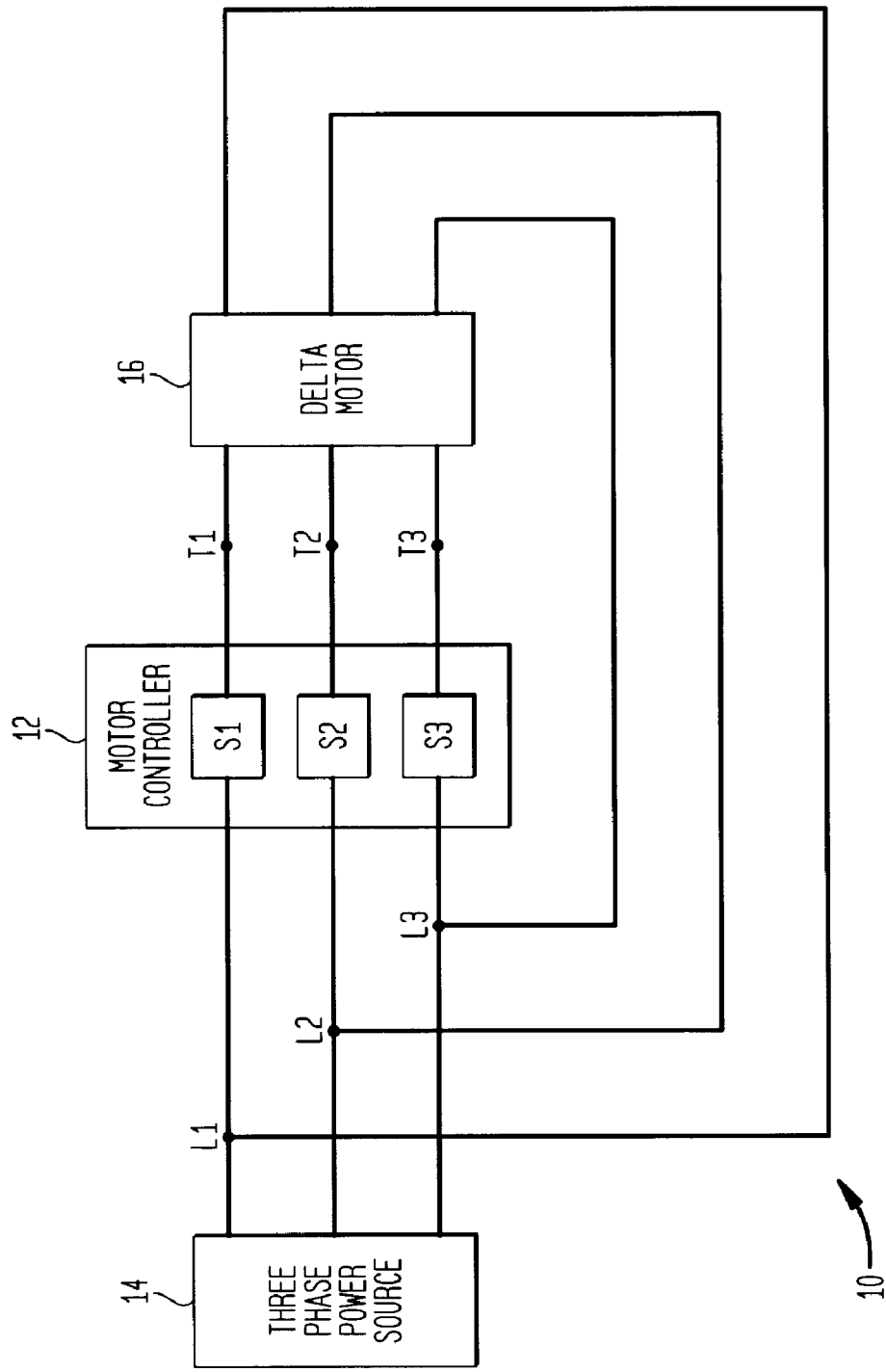
FIG. 1 shows a delta motor system including a prior art motor controller.
Figure 2:
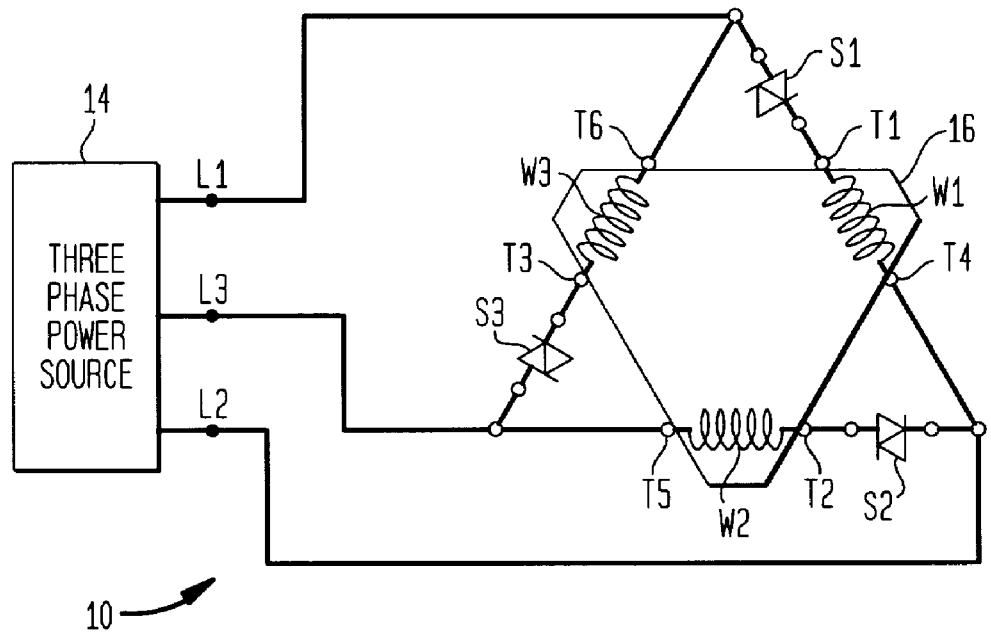
FIG. 2 illustrates the relationships between the delta motor windings, the line voltage terminals and the motor controller control switches necessary for proper motor controller operation.

FIG. 2 illustrates in detail the necessary relationships between the delta motor windings W1, W2, W3, the line voltage terminals L1, L2, L3 and the motor controller control switches S1, S2, S3 for proper motor controller operation. The motor controller's internal timing mechanisms are specifically designed to regulate the application of the three phase voltage from the three phase power source 14 to the delta motor windings W1, W2, W3 based on a predesignated wiring configuration.

The delta motor 16 consists of three windings W1, W2, W3 arranged in a delta configuration. Each winding W1, W2, W3 has a pair of associated motor terminals T1 and T4, T2 and T5, T3 and T6 respectively, that provide electrical connection to either side of each individual winding W1, W2, W3. Terminals T1, T2 and T3 are designated for connection to line voltage terminals L1, L2 and L3 respectively using the control switches S1, S2 and S3 respectively. Terminals T4, T5 and T6 are designated for connection to line voltage terminals L2, L3 and L1 respectively.

The overall layout of the control switches and the windings can be described as follows: control switch S1 and winding W1 are connected in series across line voltage terminals L1 and L2; control switch S2 and winding W2 are connected in series across line voltage terminals L2 and L3; and control switch S3 and winding W3 are connected in series across line voltage terminals L3 and L1. It is essential that the motor terminals T1, T2, T3, T4, T5, T6 be wired with the appropriate control switches S1, S2, S3 across the appropriate line voltage terminals L1, L2, L3 to enable the motor controller 12 to perform its motor torque restricting and current limiting functions.

Conventional leads are typically used to connect the delta motor windings W1, W2, W3 to the control switches S1, S2, S3 and the line voltage terminals L1, L2, L3. The electrical leads providing connection to the delta motor terminals T1, T2, T3, T4, T5 and T6 are not always clearly marked. As a result wiring mistakes during the installation process of the delta motor system 10 are common.

Figure 3:
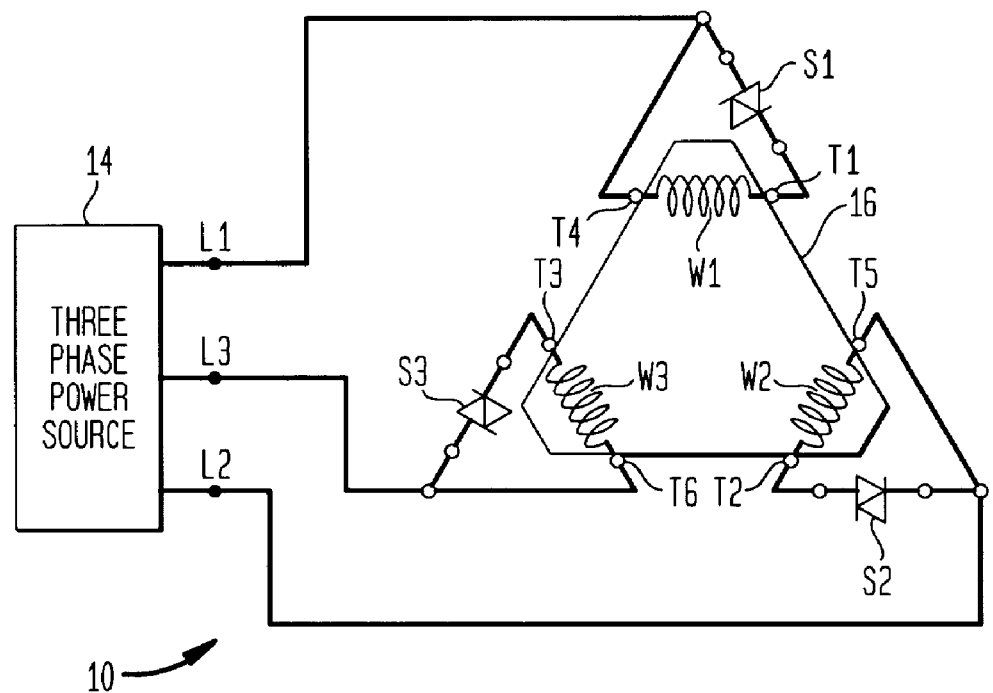
FIG. 3 shows a delta motor system wired so that all of delta motor windings are in a dead ended configuration.

A common wiring error, where all of the delta motor windings are wired in a dead ended configuration, is illustrated in FIG. 3. Specifically, the delta motor terminals T4, T5, T6 designated for electrical connection to line voltage terminals L2, L3, L1, respectively have been incorrectly connected to line voltage terminals L1, L2, L3, respectively. As a result, the winding W1 has both motor terminals T1, T4 connected to a single line voltage terminal L1, the winding W2 has both motor terminals T2, T5 connected to line voltage terminal L2 and the windings W3 has both motor terminals T3, T6 connected to line voltage terminal L3.

When the delta motor system 10 has been wired so that all three motor windings W1, W2, W3 are in a dead ended configuration and a run command is issued to the delta motor system 10, the indicator for motor controller 12 will show that it is running and the indicator for the delta motor 16 will show that the delta motor 16 is up to speed even though the delta motor 16 has not actually started and there is no current flowing through any of the windings W1, W2, W3.

Figure 4:
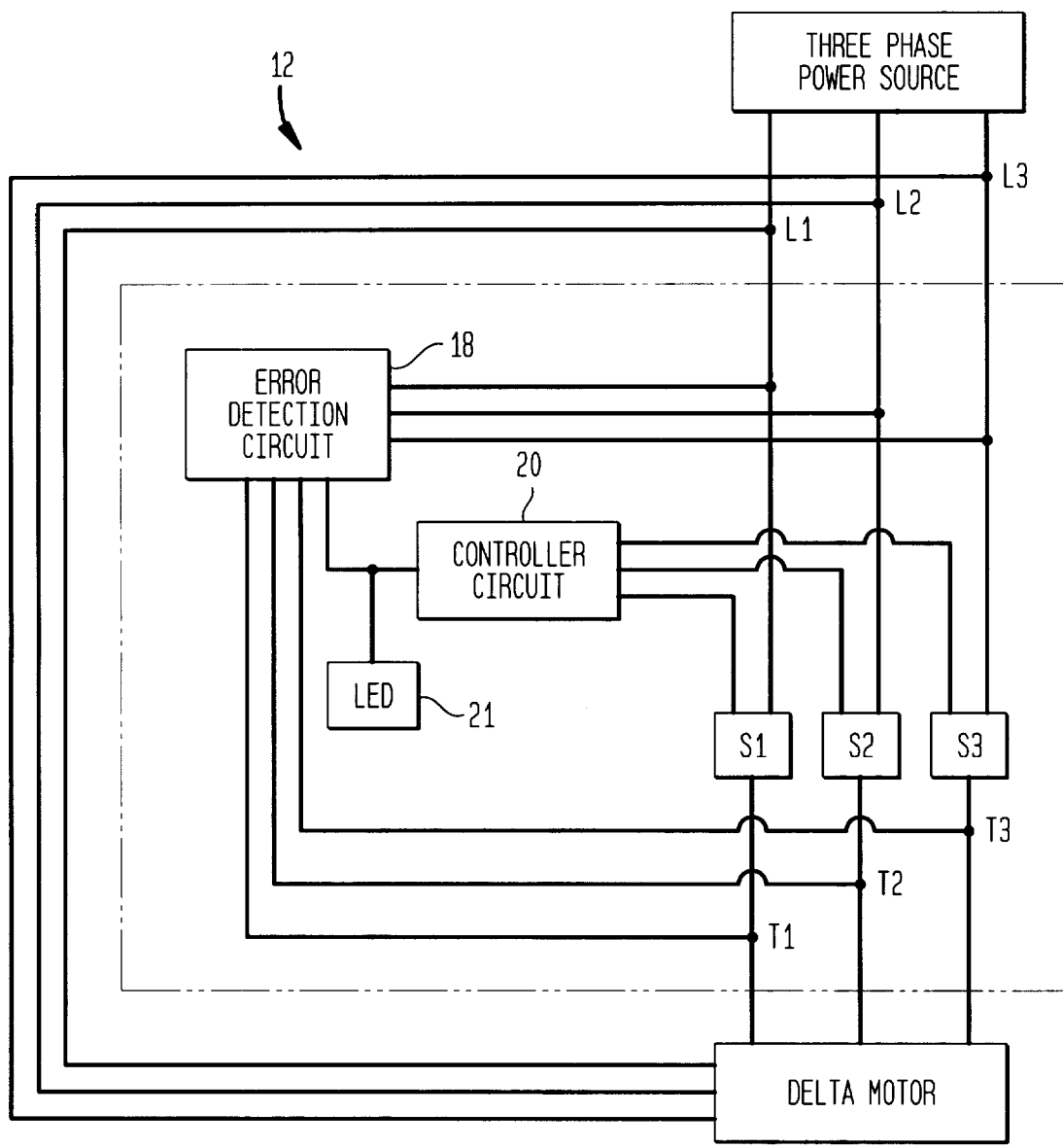
FIG. 4 depicts the motor controller according to the invention connected within a delta motor system.

An overview of the motor controller 12, according to the invention, as wired within a delta motor system 10 is depicted in FIG. 4. The motor controller 12 includes an innovative error detection circuit 18. The error detection circuit 18 is an integral part of the motor controller 12 and is electrically coupled to the line voltage terminals L1, L2, L3 and to motor terminals T1, T2, T3 across each of the individual control switches S1, S2, S3. The error detection circuit 18 manipulates the voltage readings obtained from the line voltage terminals L1, L2, L3 and the motor terminals T1, T2, T3 prior to starting the delta motor 16 to determine if the three windings W1, W2, W3 have been wired in a dead ended configuration and generates a fault signal in response to detecting such a condition.

The controller circuit 20, connected to each of the control switches S1, S2, S3 and the error detection circuit 18, controls the application of voltages from the three phase power source 14 to the delta motor 16 by controlling the operation of the control switches S1, S2, S3. The controller circuit 20 responds to the fault signal generated by the error detection circuit 18 by inhibiting operation of the delta motor 16. In addition, the error detection circuit 18 also directs the fault signal to an indicator circuit, such as for example an LED 21, that provides the user with notice of the dead ended winding wiring error.

Solid state switches such as SCRs or triacs are used to perform the control switch S1, S2, S3 functions in a preferred embodiment of the invention, however, the use of alternative switching mechanisms are also considered to be within the scope of the invention. In addition, in the illustrated embodiment, the controller circuit 20 comprises a programmed microcontroller. It should be noted that alternative hardware or software implementations of the controller circuit 20 are also within the spirit of the invention.

Figure 5:
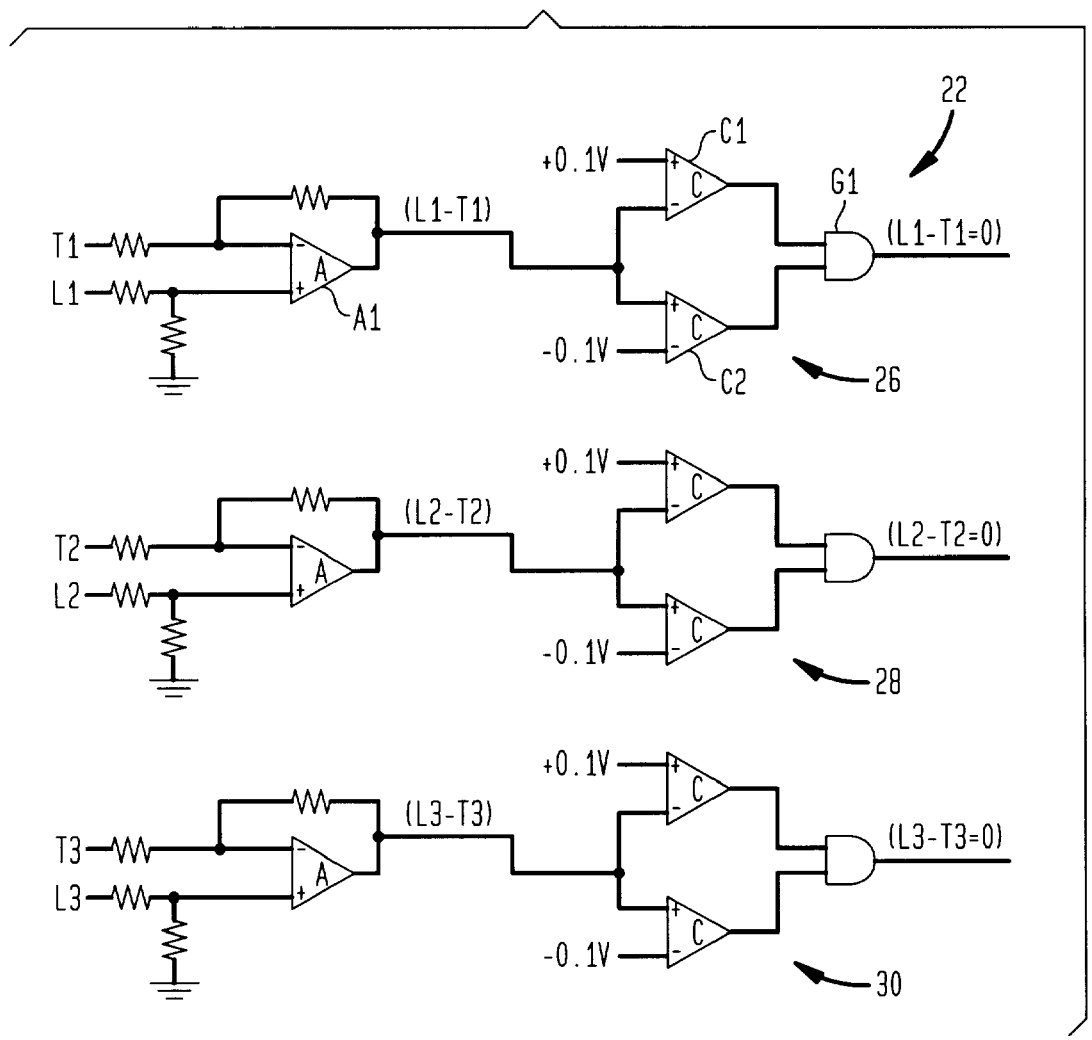
FIG. 5 is a schematic representation of the sensing circuit.
Figure 6:
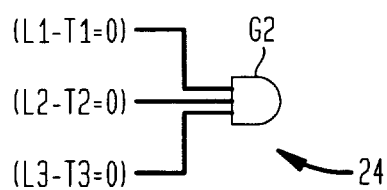
FIG. 6 is a schematic representation of the decoding circuit.

The error detection circuit 18 includes a sensing circuit 22, shown in FIG. 5 and a decoding circuit 24, shown in FIG. 6. The sensing circuit 22 accepts the three line voltages L1, L2, L3 and the three voltages at the three motor terminals designated for control switch connections T1, T2, T3 as inputs and generates a true signal for each of the following conditions that are found to be true:

Voltages Across Control Switches

Voltage (L1-T1)=0

Voltage (L2-T2)=0

Voltage (L3-T3)=0

The sensing circuit 22 consists of three similar subcircuits 26, 28, 30. The first subcircuit 26 consists of an amplifier A1, two comparators C1, C2 and an AND gate G1. The amplifier A1 accepts the voltage at motor terminal T1 as its negative input and the line voltage at terminal L1 as its positive input and generates the difference between the two (L1-T1), the voltage across control switch S1, as its output. The comparator C1 accepts the amplifier A1 output, (L1-T1), as its negative input and a reference voltage +0.1 volts as its positive input and generates a true signal when (L1-T1) is less than +0.1 volts. Comparator C2 accepts the amplifier A1 output, (L1-T1), as its positive input and another reference voltage −0.1 volts as its negative input and issues a true signal when (L1-T1) is greater than −0.1 volts. Comparator C1 identifies if the voltage across control switch S1 is less than +0.1 volts and comparator C2 determines if the voltage across the control switch S1 is greater than −0.1 volts.

The AND gate G1 accepts the outputs generated by comparator C1 and comparator C2 as inputs and generates a true signal when both inputs are true. In other words, when the voltage across the control switch S1 is greater than −0.1 volts and less than +0.1 volts. For the purposes of the sensing circuit 22, a true signal issued at the output of AND gate G1 represents that the voltage (L1-T1) across the control switch S1 is essentially equal to zero.

The second and third subcircuits 28, 30 operate similarly. The second subcircuit 28 accepts the voltages at the motor terminal T2 and at the line voltage terminal L2 as inputs. A true signal is generated when the value of the voltage (L2−T2), the voltage across control switch S2, is between −0.1 volts and +0.1 volts, in which case, the voltage (L2-T2) is assumed to be equal to zero. Similarly, the third subcircuit 30 accepts the voltages at motor terminal T3 and at the line voltage terminal L3 as inputs and generates a true signal when the value of the voltage (L3-T3) across the control switch S3 is between −0.1 volts and +0.1 volts and is assumed for the purposes of the error detection circuit 18 to be equal to zero.

The decoding circuit 24, shown in FIG. 6, accepts the digital output signals generated by the sensing circuit 22 and issues a true signal when a triple dead ended winding configuration is detected. The decoding circuit consists of an AND gate G2. The AND gate G2 accepts each of the outputs generated by the subcircuits 26, 28, 30 as inputs and generates a true signal or a fault signal if all of its inputs are true. In other words, the decoding circuit 24 issues a fault signal if the voltages (L1-T1), (L2-T2), (L3-T3) across all of the control switches S1, S2, S3 is equal to zero. In a preferred embodiment of the invention, the logical functions shown in the decoding circuit 24 are performed by the microcontroller that implements the functions of the controller circuit 20. While the illustrated embodiment focuses on a particular implementation of the error detection circuit 20, other equivalent hardware and software implementations of the logic disclosed also fall within the scope of the invention.

Figure 7A:
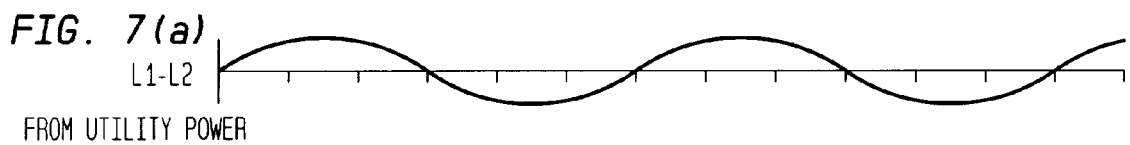
FIGS. 7(a)–7(f) illustrate the waveforms for the digital signals representative of the voltages across the individual control switches relative to the line to line voltages for a correctly wired delta motor system.
Figure 7B:
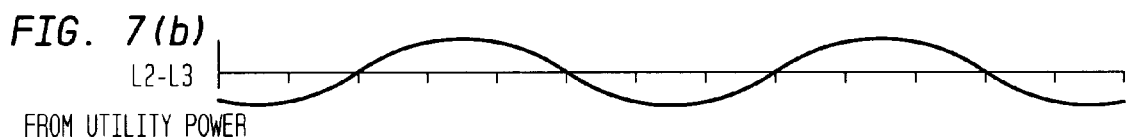
Figure 7C:
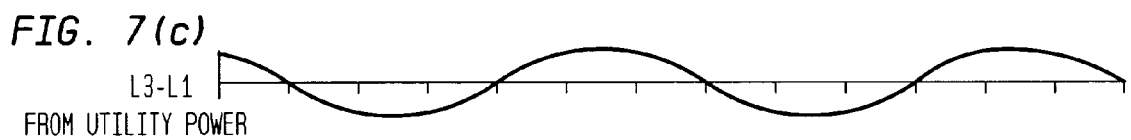
Figure 7D:
Figure 7E:
Figure 7F:
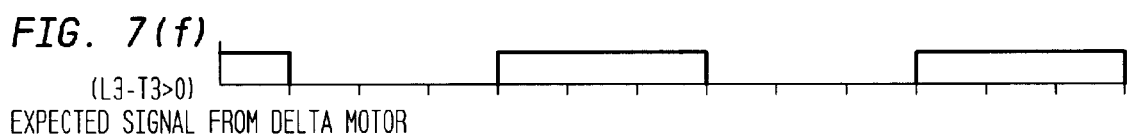
Figure 8A:
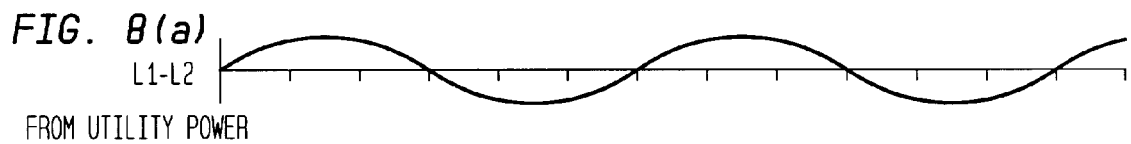
FIGS. 8(a)–8(f) illustrate the waveforms for the digital signals representative of the voltages across the individual control switches for a delta motor system where all of the delta motor windings are wired in a dead ended configuration.
Figure 8B:
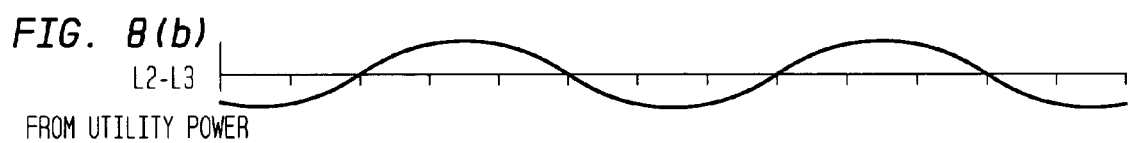
Figure 8C:
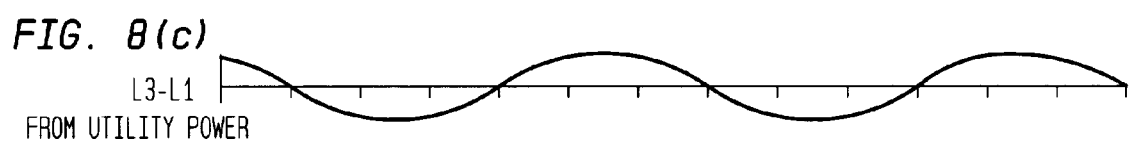
Figure 8D:
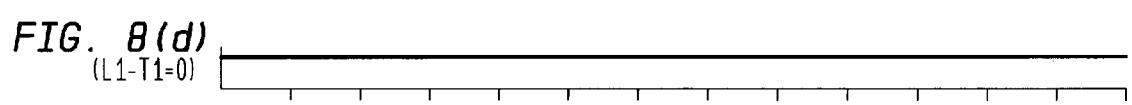
Figure 8E:
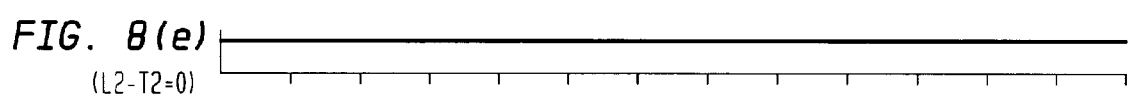
Figure 8F:
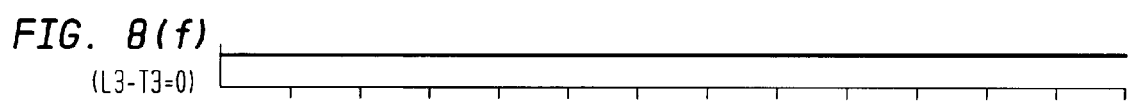

FIG. 7 illustrates the waveforms for the line to line voltages (L1-L2), (L2−L3) and (L3-L1) and the digital signals showing when each of the voltages across the control switches (L1-T1), (L2-T2), (L3-T3) are greater than zero for a correctly wired delta motor system 10. The following observations can be made when the delta system 10 is correctly configured for operation:

(i) the first control switch S1 is connected across line voltage terminals L1 and L2 and the voltage across the first control switch (L1-T1), shown in FIG. 7(d), and the line to line voltage (L1-L2), shown in FIG. 7(a), are synchronously greater than zero;

(ii) the second control switch S2 is connected across line voltage terminals L2 and L3 and the voltage across the second control switch (L2-T2), shown in FIG. 7(e), and the line to line voltage (L2-L3), shown in FIG. 7(b), are synchronously greater than zero; and (iii) the third control switch S3 is connected across line voltage terminals L3 and L1 and the voltage across the third control switch (L3-T3), shown in FIG. 7(f), and the line to line voltage (L3-L1), shown in FIG. 7(c), are synchronously greater than zero.

When all of the three of the delta motor windings W1, W2, W3 are wired in a dead ended configuration, the relationships observed above are altered. FIG. 8 illustrates the waveforms for the digital signals representative of the voltages (L1-T1), (L2-T2), (L3-T3) across the individual control switches S1, S2, S3 for a delta motor system 10 wired in a dead ended winding configuration relative to the line to line voltages (L1-L2), (L2-L3), (L3-L1). These changed relationships are used by the decoding circuit 24 to identify the incorrect wiring configuration.

When each of the three of the windings W1, W2, W3 are wired to single line voltages' terminals so that they are dead ended, there is no current flowing through any of the windings W1, W2, W3 or the control switches S1, S2, S3 connected to the windings W1, W2, W3. As a result, there is no voltage across any of the control switches S1, S2, S3. The digital signals generated by the sensing circuit 22 indicating if the voltages (L1-T1), (L2-T2) and (L3-T3) across control switches S1, S2 and S3 are equal to zero are all true. This is shown in FIGS. 8 (d), (e) and (f) respectively. The decoder circuit 24 logic identifies when the voltages across all of the individual control switches S1, S2, S3 are equal to zero and issues a fault signal indicating that all of the windings are dead ended.

The motor controller 12 uses the error detection circuit 18 to determine if the delta motor windings W1, W2, W3 are all dead ended. Upon detection of such a condition, the error detection circuit 18 generates a fault signal that is routed to an LED 21 to provide warning of the faulty wiring to the user and to the controller circuit 20 which in turn inhibits operation of the delta motor 16. It will be appreciated that since the entire error detection process occurs prior to actually turning on the delta motor 16 and the dead ended windings configuration can be detected and corrected during the installation process resulting in reduced troubleshooting time and expenses.

The foregoing disclosure of specific embodiments is intended to be illustrative of the broad concepts comprehended by the invention. claims

I claim:

1. For use in a motor system including a multiphase power source having three supply lines and a delta motor having three windings, each winding having a first lead and a second lead, the first lead of each winding intended for connection to a selected supply line, a motor controller comprising:

a plurality of switching means each having a first lead for connection to a selected supply line and a second lead for connection to a selected motor winding; and an error detecting means connected across each of the switching means and operable to detect a fault condition if both the first and second leads of each of the windings are connected to a single one of the supply lines.

2. The motor controller according to claim 1, including an indicating means connected to the error detecting means for generating a fault indication in response to the fault condition.

3. The motor controller according to claim 1, wherein the plurality of switching means comprise solid state devices.

4. The motor controller according to claim 1, wherein the plurality of switching means comprise SCRs.

5. The motor controller according to claim 1, wherein the plurality of switching means comprise triacs.

6. For use in a motor system including a multiphase power source having first, second and third supply lines and a delta motor having first, second and third windings, each winding having first and second leads, the first lead of the first, second and third windings intended for connection to the second, third and first supply lines respectively, a motor controller comprising:

a first switching means intended for connection between the first supply line and the second lead of the first winding;

a second switching means intended for connection between the second supply line and the second lead of the second winding;

a third switching means intended for connection between the third supply line and the second lead of the third winding; and an error detecting means connected across the switching means and operable to detect a fault condition if both the first and second leads of each of the windings are connected to a single one of the supply lines.

7. The motor controller according to claim 6, including an indicating means connected to the error detecting means and operable to generate a fault indication in response to the fault condition.

8. The motor controller according to claim 6, wherein the error detecting means further comprises a sensing means connected across each of the switching means and operable to generate a plurality of outputs representative of the voltages across each of the switching means.

9. The motor controller according to claim 8, wherein the error detecting means further comprises a decoding means connected to the sensing means for detecting the fault condition if the voltages across each of the individual switching means is equal to zero.

10. The motor controller according to claim 6, wherein the switching means comprise solid state devices.

11. The motor controller according to claim 6, wherein the switching means comprise SCRs.

12. The motor controller according to claim 6, wherein the switching means comprise triacs.

13. For use in a motor system including a multiphase power source having first, second and third supply lines and a delta motor having first, second and third windings, each winding having first and second leads, the first lead of the first, second and third windings intended for connection to the second, third and first supply lines respectively, a motor controller comprising:

a first switching means intended for connection between the first supply line and the second lead of the first winding;

a second switching means intended for connection between the second supply line and the second lead of the second winding;

a third switching means intended for connection between the third supply line and the second lead of the third winding;

a sensing means connected across each of the switching means and operable to generate a plurality of outputs representative of the voltages across each of the switching means;

a decoding means connected to the sensing means for detecting a fault condition if the voltages across each of the individual switching means is equal to zero; and an indicating means connected to the decoding means and operable to generate a fault indication in response to the fault condition.

\* \* \* \* \*